США005227792A

United States Patent [19]
Lee

[11] Patent Number: 5,227,792
[45] Date of Patent: Jul. 13, 1993

[54] SUPERCONDUCTING ANALOG-TO-DIGITAL CONVERTER WITH A TRIPLE-JUNCTION REVERSIBLE FLIP-FLOP BIDIRECTIONAL COUNTER

[75] Inventor: Gregory S. Lee, Mountain View, Calif.

[73] Assignee: TRW Inc., Redondo Beach, Calif.

[21] Appl. No.: 813,731

[22] Filed: Dec. 27, 1991

[51] Int. Cl.$^5$ .................. H03M 1/00; H03M 1/20
[52] U.S. Cl. ............................. 341/133; 341/171; 307/277; 307/476
[58] Field of Search ............. 341/133, 171; 505/827; 307/277, 476

[56] References Cited

U.S. PATENT DOCUMENTS

| | | | |
|---|---|---|---|
| 4,646,060 | 2/1987 | Phillips et al. | 341/171 |
| 4,922,250 | 5/1990 | Phillips et al. | 341/133 |
| 5,012,243 | 4/1991 | Lee | 341/133 |
| 5,019,818 | 5/1991 | Lee | 341/133 |

OTHER PUBLICATIONS

Fulton, T. A. et al., "The Flux Shuttle-A Josephson Junction Shift Register Employing Single Flux Quanta," Proceedings of the IEEE, vol. 61, No. 1, Jan. 1973, pp. 28–35.
Clarke, John, "The Application of Josephson Junctions to Computer Storage and Logic Elements and to Magnetic Measurements," AIP Conference Proceedings, No. 29, 1976, pp. 17–22.
Likharev, K. K., "Dynamics of Some Single Flux Quantum Devices: I. Parametric Quantron and II. Inhomogeneous Flux Shuttle," IEEE Transactions on Magnetics, vol. MAG-13, No. 1, Jan. 1977, pp. 242–247.

Primary Examiner—Sharon D. Logan
Attorney, Agent, or Firm—James M. Steinberger; Sol L. Goldstein

[57] ABSTRACT

A high-performance superconducting analog-to-digital (A/D) converter providing high-speed, high-resolution A/D conversion with low power consumption. The superconducting A/D converter of the present invention includes a bidirectional binary counter having n stages of triple-junction reversible flip-flops, where n is the number of bits of the digital output, and a pair of superconducting inductors for inductively coupling an analog input current to the bidirectional counter. The bidirectional counter algebraically counts incremental changes in the analog input current, increasing the binary count for positive incremental changes in the analog current and decreasing the binary count for negative incremental changes in the analog current. The bidirectional counter requires no gate bias, thus requiring minimal power for operation.

15 Claims, 1 Drawing Sheet

SUPERCONDUCTING ANALOG-TO-DIGITAL CONVERTER WITH A TRIPLE-JUNCTION REVERSIBLE FLIP-FLOP BIDIRECTIONAL COUNTER

This invention was made with Government support under Contract No. SDI084-88-C-0041 awarded by the Department of Defense, Strategic Defense Initiative Organization. The Government has certain rights in this invention.

BACKGROUND OF THE INVENTION

This invention relates generally to superconducting analog-to-digital converters and, more particularly, to high-performance superconducting analog-to-digital converters employing bidirectional counters.

High-performance analog-to-digital (A/D) converters are required in a variety of commercial and military electronic devices. Two important measures of an A/D converter's performance are speed, which is the number of samples generated by the A/D converter per second, and resolution, which is the smallest increment of change that can be detected in an analog signal. Superconducting technology is particularly well suited for performing high-speed, high-resolution A/D conversion because superconducting Josephson tunnel junctions, which provide the basic switching functions for many superconducting electronic devices, including superconducting A/D converters, possess a unique combination of speed, sensitivity, and periodic response characteristics. Josephson junctions are typically combined with one or more inductive loads in a superconducting loop to form a logic circuit called a superconducting quantum interference device (SQUID).

U.S. Pat. No. 5,012,243 to the present inventor discloses a high-speed, high-resolution superconducting analog-to-digital converter having a double-junction SQUID quantizer and a bidirectional binary counter employing n stages of four-junction SQUID flip-flops, where n is the number of bits of the digital output. The SQUID quantizer digitizes an analog input current by generating a measurable voltage pulse across one of the Josephson junctions each time the current changes by an incremental amount. These up-count and down-count voltage pulses are of the same polarity and are generated on two different output lines. The bidirectional binary counter algebraically counts the voltage pulses, increasing the binary count when upcount pulses are received and decreasing the binary count when down-count pulses are received. The incremental change in current required for a voltage pulse is equal to a single flux quantum ($2.07 \times 10^{-15}$ weber) divided by the inductance (measured in Henries) of the quantizer. Therefore, the incremental change in current is very small, thus providing both high-speed and high-resolution A/D conversion.

A third measure of an analog-to-digital converter's performance is power consumption, which is particularly important in superconducting electronic devices such as infrared focal plane arrays. Ideally, the power consumption of an entire channel of an infrared focal plane array should be limited to about 10 microwatts. This limits the power consumption of the A/D converter in each channel, which may have up to 12 bits or more of digital output, to about one microwatt. However, the analog-to-digital converter described above, as well as other high-performance superconducting A/D converters, cannot meet this stringent power requirement because of the power drain caused by the gate bias of the counter. Accordingly, there has been a need for a high-performance superconducting analog-to-digital converter having low power consumption. The present invention fulfills this need.

SUMMARY OF THE INVENTION

The present invention resides in a high-performance superconducting analog-to-digital (A/D) converter providing high-speed, high-resolution A/D conversion with low power consumption. The superconducting A/D converter of the present invention includes a bidirectional binary counter having n stages of triple-junction reversible flip-flops, where n is the number of bits of the digital output, and a pair of superconducting inductors for inductively coupling an analog input current to the bidirectional counter. The bidirectional counter algebraically counts incremental changes in the analog input current, increasing the binary count for positive incremental changes in the analog current and decreasing the binary count for negative incremental changes in the current. The bidirectional counter requires no gate bias, thus requiring minimal power for operation.

The bidirectional binary counter includes n stages of triple-junction reversible flip-flops connected together in a cascade arrangement from the least significant bit ((LSB) to the most significant bit (MSB), with the analog input current being inductively coupled to the LSB flip-flop. Each triple-junction reversible flip-flop includes three shunted Josephson tunnel junctions and a superconducting inductor connected in a bridge circuit. The triple-junction reversible flip-flop is a bistable logic circuit in which the direction of the circulating current in the flip-flop determines the state of the circuit. A 0 bit is represented by a clockwise circulating current in the upper portion of the flip-flop and a counterclockwise circulating current in the lower portion of the flip-flop. A 1 bit is represented by a counterclockwise circulating current in the upper portion of the flip-flop and a clockwise circulating current in the lower portion of the flip-flop.

A flux bias is applied to each reversible flip-flop by an inductor which inductively couples the flux bias to the flip-flop. The flux bias generates a clockwise circulating current in the upper portion of the flip-flop and a counterclockwise circulating current in the lower portion of the flip-flop, initializing each flip-flop to the 0 state. As the analog input current increases, an induced input current begins to flow through the Josephson junctions in the LSB flip-flop. The induced input current adds to the circulating current in two of the Josephson junctions and subtracts from the circulating current in the other Josephson junction. When the analog input current increases enough that the sums of the circulating and induced input currents through the two Josephson junctions exceed the critical currents of these junctions, the junctions momentarily enter their voltage states. This positive incremental change in the analog input current causes the circulating currents in the LSB flip-flop to reverse direction, changing the LSB flip-flop to the 1 state. The Josephson junctions are shunted to stabilize the new state without excessive oscillation.

An additional incremental change in the analog input current induces a current in the first two stages of reversible flip-flops that causes the LSB flip-flop to change back to the 0 state and the second stage flip-flop to change to the 1 state. In this manner, an increasing analog input current induces a current that advances through the stages of flip-flops, causing one or more of the flip-flops to toggle or reverse state at each additional incremental change in the analog current. The effect of each toggling action is to successively change each flip-flop in the 1 state, beginning with the LSB flip-flop, back to the 0 state until a flip-flop in the 0 state is reached. This flip-flop is then changed to the 1 state and the operation is terminated. This toggling action continues for each additional incremental change in the analog input current until all of the flip-flops have been changed to the state. The flip-flops are reversible, so a decreasing analog input current causes the reverse toggling action to occur until all of the flip-flops have been changed back to the 0 state. The state of each flip-flop is read by a superconducting quantum interference device (SQUID) readout circuit which senses the direction of the circulating current in the flip-flop.

It will be appreciated from the foregoing that the present invention represents a significant advance in the field of superconducting analog-to-digital converters. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
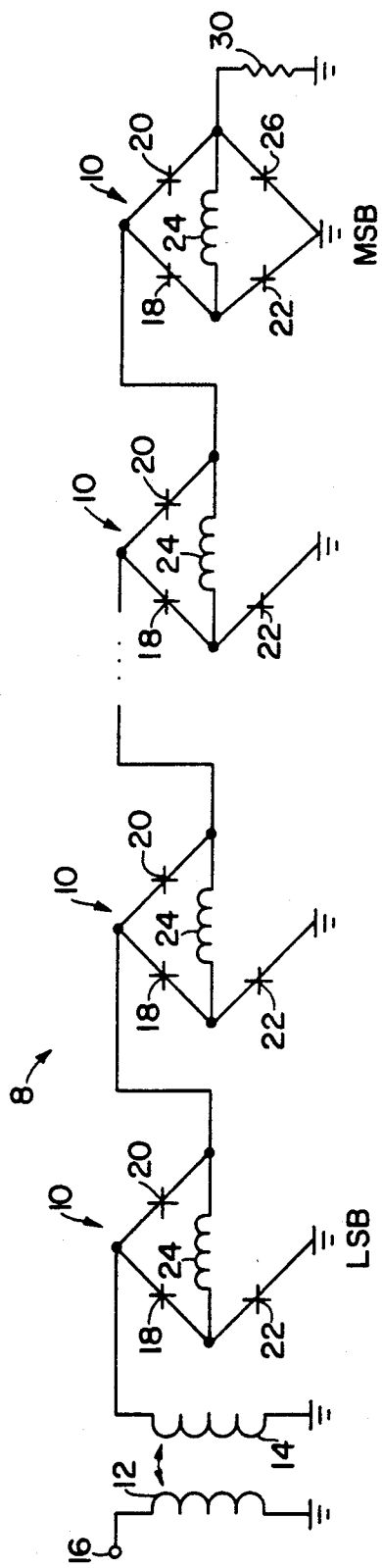
FIG. 1 is a circuit diagram of a high-performance superconducting analog-to-digital converter in accordance with the present invention.

As shown in the drawings for purposes of illustration, the present invention is embodied in a high-performance superconducting analog-to-digital (A/D) converter providing high-speed, high-resolution A/D conversion with low power consumption. As illustrated in FIG. 1, the superconducting A/D converter of the present invention includes a bidirectional binary counter 8 having n stages of triple-junction reversible flip-flops 10, where n is the number of bits of the digital output, and a pair of superconducting inductors 12, 14 for inductively coupling an analog input current, on line 16, to the bidirectional counter 8. The bidirectional counter 8 algebraically counts incremental changes in the analog input current, increasing the binary count for positive incremental changes in the analog current and decreasing the binary count for negative incremental changes in the current.

The bidirectional binary counter 8 includes n stages of triple-junction reversible flip-flops 10 connected together in a cascade arrangement from the least significant bit (LSB) to the most significant bit (MSB), with the analog input current being inductively coupled to the LSB flip-flop 10. The analog input current can also be directly applied to the LSB flip-flop. Each triple-junction reversible flip-flop 10 includes three shunted Josephson tunnel junctions 18, 20, 22 and a superconducting inductor 24 connected in a bridge circuit. One terminal of each of the Josephson junctions 18, 20 is connected together and the other terminal of each of the Josephson junctions 18, 20 is connected to a different terminal of the inductor 24. One terminal of Josephson junction 22 is connected to the terminal between Josephson junction 18 and inductor 24 and the other terminal of Josephson junction 22 is connected to ground. The terminal between Josephson junction 20 and inductor 24 is connected to the next higher stage of the A/D converter at the terminal between Josephson junctions 18, 20. This same terminal of the MSB flip-flop 10 is connected to ground through a shunted Josephson tunnel junction 26. Each Josephson junction 18, 20, 22 is shunted by a resistor 28 and Josephson junction 26 is shunted by a resistor 30.

Each triple-junction reversible flip-flop 10 is a bistable logic circuit in which the direction of the circulating current in the flip-flop determines the state of the circuit. A 0 bit is represented by a clockwise circulating current in the upper portion of the flip-flop, circulating through Josephson junctions 18, 20 and inductor 24, and a counterclockwise circulating current in the lower portion of the flip-flop, circulating through Josephson junction 22, inductor 24 and the flip-flop 10 of the next higher stage. A 1 bit is represented by a counterclockwise circulating current in the upper portion of the flip-flop and a clockwise circulating current in the lower portion of the flip-flop.

Figure 2:
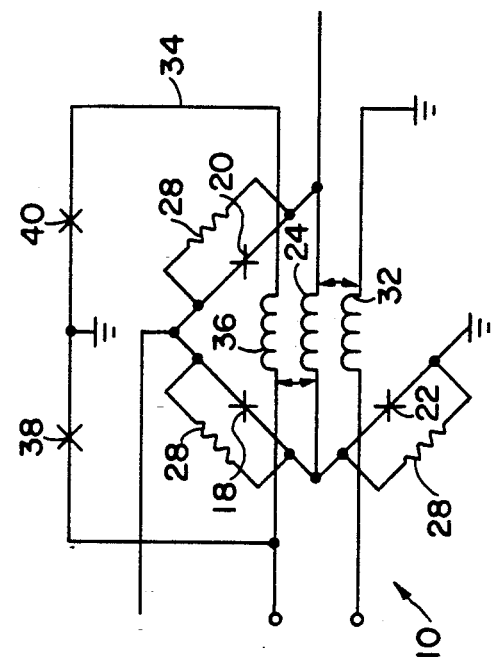
FIG. 2 is a detailed circuit diagram of a triple-junction reversible flip-flop.

As shown in FIG. 2, a flux bias is applied to each flip-flop 10 by an inductor 32 which inductively couples the flux bias to the flip-flop. The flux bias generates a clockwise circulating current in the upper portion of each flip-flop 10 and a counterclockwise circulating current in the lower portion of the flip-flop, initializing each flip-flop to the 0 state. As the analog input current on line 16 increases, an induced input current begins to flow through the Josephson junctions in the LSB flip-flop 10. The induced input current adds to the circulating current in Josephson junctions 20, 22 and subtracts from the circulating current in Josephson junction 18. When the analog input current increases enough that the sums of the circulating and induced input currents through Josephson junctions 20, 22 exceed the critical currents of these junctions, the junctions momentarily enter their voltage states. This positive incremental change in the analog input current causes the circulating currents in the LSB flip-flop 10 to reverse direction, changing the LSB flip-flop to the 1 state. There is now a clockwise circulating current in the lower portion of the LSB flip-flop which is fed forward to the second stage flip-flop. The Josephson junctions 18, 20, 22 are shunted to stabilize the new state without excessive oscillation.

An additional incremental change in the analog input current induces a current in the first two stages of flip-flops 10 that causes Josephson junction 18 of the LSB flip-flop and Josephson junctions 20, 22 of the second stage flip-flop to momentarily enter their voltage states. This causes the LSB flip-flop to change back to the 0 state and the second stage flip-flop to enter the 1 state. There is now a clockwise circulating current in the lower portion of the second stage flip-flop which is fed forward to the third stage flip-flop. In this manner, an increasing analog input current induces a current that advances through the stages of flip-flops 10, causing one or more of the flip-flops to toggle or reverse state at each additional incremental change in the analog current.

The effect of each toggling action is to successively change each flip-flop 10 in the 1 state, beginning with the LSB flip-flop, back to the 0 state until a flip-flop in the 0 state is reached. This flip-flop is then changed to the 1 state and the operation is terminated. This toggling action continues for each additional incremental change in the analog input current until all of the flip-flops have been changed to the 1 state. The sequence for an increasing analog input current with four stages of flip-flops is 0000, 0001, 0010, 0011, 0100, 0101, 0110, 0111, 1000, 1001, 1010, 1011, 1100, 1101, 1110, and 1111.

The flip-flops 10 are reversible, so a decreasing analog input current causes the reverse toggling action to occur until all of the flip-flops have been changed back to the 0 state. The effect of this reverse toggling action is to successively change each flip-flop 10 in the 0 state, beginning with the LSB flip-flop, to the 1 state until a flip-flop in the 1 state is reached. This flip-flop is then changed back to the 0 state and the operation is terminated. The state of each reversible flip-flop 10 is read by a superconducting quantum interference device (SQUID) readout circuit 34 which senses the direction of the circulating current in the flip-flop. The SQUID readout circuit 34 includes a superconducting inductor 36 and two Josephson tunnel junctions 38, 40 connected in a superconducting loop.

In the preferred embodiment of the present invention, the inductance of the electrical interconnect between each flip-flop 10 is preferably limited to a few picoHenries. The areas of the Josephson junctions 18, 20, 22, 26 can be scaled to adjust the critical currents ($I_c$) of the junctions, although a wide range of $I_c$ ratios between the Josephson junctions is permissible.

The high-performance superconducting A/D converter of the present invention provides both high-speed and high-resolution A/D conversion with low power consumption. This low power consumption is achieved primarily by eliminating the gate bias of the counter. Although a flux bias is used, there is no requirement that the flux bias dissipate power on the chip. Elimination of the gate bias allows for a wide range of count rates and removes concerns over gate bias margins, optimization of gate bias drift versus count rate, negative resistance, and counter feedback.

From the foregoing, it will be appreciated hat the present invention represents a significant advance in the field of superconducting analog-to-digital converters. Although a preferred embodiment of the invention has been shown and described, it will be apparent that other adaptations and modifications can be made without departing from the spirit and scope of the invention. Accordingly, the invention is not to be limited, except as by the following claims.

I claim:

1. A high-performance superconducting analog-to-digital converter, comprising:

a bidirectional binary counter having n stages of triple-junction reversible flip-flops connected together in a cascade arrangement from the least significant bit (LSB) to the most significant bit (MSB) where n is the number of bits of the digital output, each triple-junction reversible flip-flop including first, second and third shunted Josephson tunnel junctions and a superconducting inductor connected in a bridge circuit, the Josephson junctions and the inductor forming upper and lower portions of the flip-flop, each reversible flip-flop being a bistable logic circuit in which the direction of the circulating current determines the state of the circuit; and means for applying an analog input current to the bidirectional counter;

wherein the bidirectional counter algebraically counts incremental changes in the analog input current, increasing the binary count for positive incremental changes in the analog current and decreasing the binary count for negative incremental changes in the current, and wherein the counter does not require a gate bias, thus minimizing power dissipation.

2. The high-performance superconducting analog-to-digital converter as set forth in claim 1, wherein the means for applying an analog input current includes:

a pair of superconducting inductors for inductively coupling the analog input current to the LSB flip-flop.

3. The high-performance superconducting analog-to-digital converter as set forth in claim 1, wherein a 0 bit is represented by a clockwise circulating current in the upper portion of the flip-flop and a counterclockwise circulating current in the lower portion of the flip-flop, and a 1 bit is represented by a counterclockwise circulating current in the upper portion of the flip-flop and a clockwise circulating current in the lower portion of the flip-flop.

4. The high-performance superconducting analog-to-digital converter as set forth in claim 3, wherein a positive incremental change in the analog input current causes a toggling action in which each reversible flip-flop in the 1 state, beginning with the LSB flip-flop, is successively changed to the 0 state until a flip-flop in the 0 state is reached, then this flip-flop is changed to the 1 state and the toggling action is terminated, and wherein a negative incremental change in the analog input current causes a toggling action in which each reversible flip-flop in the 0 state, beginning with the LSB flip-flop, is successively changed to the 1 state until a flip-flop in the 1 state is reached, then this flip-flop is changed to the 0 state and the toggling action is terminated.

5. The high-performance superconducting analog-to-digital converter as set forth in claim 1, and further including an inductor for inductively coupling a flux bias to each reversible flip-flop.

6. The high-performance superconducting analog-to-digital converter as set forth in claim 1, and further including a superconducting quantum interference device (SQUID) readout circuit for sensing the direction of the circulating current in each reversible flip-flop.

7. The high-performance superconducting analog-to-digital converter as set forth in claim 1, wherein each Josephson junction has a positive and a negative terminal and the positive terminal of each of the first and second Josephson junctions is connected together and the negative terminal of each of the first and second Josephson junctions is connected to a different terminal of the inductor, and wherein the positive terminal of the third Josephson junction is connected to the negative terminal of the first Josephson junction and the negative terminal of the third Josephson junction is connected to ground, and wherein the negative terminal of the second Josephson junction is connected to the next higher stage of the counter to the negative terminal of the first Josephson junction, the negative terminal of the second Josephson junction of the MSB flip-flop being connected to ground through a fourth Josephson tunnel junction, and wherein each of the Josephson junctions is shunted by a resistor.

8. A bidirectional binary counter, comprising:

n stages of triple-junction reversible flip-flop connected together in a cascade arrangement from the least significant bit (LSB) to the most significant bit (MSB) where n is the number of bits of the counter, each triple-junction reversible flip-flop including first, second and third shunted Josephson tunnel junctions and a superconducting inductor connected in a bridge circuit, the Josephson junctions and the inductor forming upper and lower portions of the flip-flop, each reversible flip-flop being a bistable logic circuit in which the direction of the circulating current determines the state of the circuit;

wherein the bidirectional counter algebraically counts incremental changes in an analog input current, increasing the binary count for positive incremental changes in the analog current and decreasing the binary count for negative incremental changes in the current, and wherein the counter does not require a gate bias, thus minimizing power dissipation.

9. The bidirectional binary counter as set forth in claim 8, and further including:
means for applying the analog input current to the bidirectional counter.

10. The bidirectional binary counter as set forth in claim 9, wherein the means for applying the analog input current includes:
a pair of superconducting inductors for inductively coupling the analog input current to the LSB flip-flop.

11. The bidirectional binary counter as set forth in claim 8, wherein
first, second and third shunted Josephson tunnel junctions and a superconducting inductor connected in a bridge circuit, the Josephson junctions and the inductor forming upper and lower portions of the flip-flop;
wherein each reversible flip-flop is a bistable logic circuit in which the direction of the circulating current determines the state of the circuit, a 0 bit is represented by a clockwise circulating current in the upper portion of the flip-flop and a counterclockwise circulating current in the lower portion of the flip-flop, and a 1 bit is represented by a counterclockwise circulating current in the upper portion of the flip-flop and a clockwise circulating current in the lower portion of the flip-flop.

12. The bidirectional binary counter as set forth in claim 11, wherein a positive incremental change in the analog input current causes a toggling action in which each reversible flip-flop in the 1 state, beginning with the LS flip-flop, is successively changed to the 0 state until a flip-flop in the 0 state is reached, then this flip-flop is changed to the 1 state and the toggling action is terminated, and wherein a negative incremental change in the analog input current causes a toggling action in which each reversible flip-flop in the 0 state, beginning with the LSB flip-flop, is successively changed to the 1 state until a flip-flop in the 1 state is reached, then this flip-flop is changed to the 0 state and the toggling action is terminated.

13. The bidirectional binary counter as set forth in claim 8, and further including an inductor for inductively coupling a flux bias to each reversible flip-flop.

14. The bidirectional binary counter as set forth in claim 8, and further including a superconducting quantum interference device (SQUID) readout circuit for sensing the direction of the circulating current in each reversible flip-flop.

15. The bidirectional binary counter as set forth in claim 8, wherein each Josephson junction has a positive and a negative terminal and the positive terminal of each of the first and second Josephson junctions is connected together and the negative terminal of each of the first and second Josephson junctions is connected to a different terminal of the inductor, and wherein the positive terminal of the third Josephson junction is connected to the negative terminal of the first Josephson junction and the negative terminal of the third Josephson junction is connected to ground, and wherein the negative terminal of the second Josephson junction is connected to the next higher stage of the counter to the negative terminal of the first Josephson junction, the negative terminal of the second Josephson junction of the MSB flip-flop being connected to ground through a fourth Josephson tunnel junction, and wherein each of the Josephson junctions is shunted by a resistor.

* * * * *